(12) United States Patent
Pan et al.

(10) Patent No.: US 10,522,974 B2
(45) Date of Patent: *Dec. 31, 2019

(54) EDGE-EMITTING LASER HAVING SMALL VERTICAL EMITTING ANGLE

(71) Applicant: TRUELIGHT CORPORATION, Hsinchu (TW)

(72) Inventors: Chien Hung Pan, Hualien County (TW); Cheng-Ju Wu, Hsinchu County (TW)

(73) Assignee: TrueLight Corporation (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/994,971

(22) Filed: May 31, 2018

(65) Prior Publication Data

US 2018/0366908 A1    Dec. 20, 2018

Related U.S. Application Data

(63) Continuation of application No. 15/624,934, filed on Jun. 16, 2017, now Pat. No. 10,014,663.

(51) Int. Cl.

| | |
|---|---|
| *H01S 5/00* | (2006.01) |
| *H01S 5/20* | (2006.01) |
| *H01S 5/32* | (2006.01) |
| *H01S 5/323* | (2006.01) |
| *H01S 5/343* | (2006.01) |

(52) U.S. Cl.
CPC .......... *H01S 5/2027* (2013.01); *H01S 5/2018* (2013.01); *H01S 5/2031* (2013.01); *H01S 5/3211* (2013.01); *H01S 5/3219* (2013.01); *H01S 5/3235* (2013.01); *H01S 5/3213* (2013.01); *H01S 5/34306* (2013.01); *H01S 2301/18* (2013.01)

(58) Field of Classification Search
CPC .... H01S 5/2027; H01S 5/3219; H01S 5/2018; H01S 5/3235; H01S 5/3211; H01S 5/34306; H01S 5/2031; H01S 5/3213; H01S 2301/18

See application file for complete search history.

(56) References Cited

U.S. PATENT DOCUMENTS 6,560,259 B1 * 5/2003 Hwang ................ B82Y 20/00
                                                             372/102
10,014,663 B1 * 7/2018 Pan ....................... H01S 5/2027
(Continued)

*Primary Examiner* — Kinam Park

(57) ABSTRACT

An edge-emitting laser having a small vertical emitting angle includes an upper cladding layer, a lower cladding layer and an active region layer sandwiched between the upper and lower cladding layers. By embedding a passive waveguide layer within the lower cladding to layer, an extended lower cladding layer is formed between the passive waveguide layer and the active region layer. In addition, the refractive index (referred as n-value) of the passive waveguide layer is larger than the n-value of the extended lower cladding layer. The passive waveguide layer with a larger n-value would guide the light field to extend downward. The extended lower cladding layer can separate the passive waveguide layer and the active region layer and thus expand the near-field distribution of laser light field in the resonant cavity, so as to obtain a smaller vertical emitting angle in the far-field laser light field.

7 Claims, 13 Drawing Sheets

(56) References Cited

U.S. PATENT DOCUMENTS

2010/0316076 A1* 12/2010 Behfar ................. G02B 6/4214
372/45.01
2015/0333482 A1* 11/2015 Briggs ................. H01S 5/3402
372/45.01
2017/0179680 A1* 6/2017 Mahgerefteh ...... G02B 6/12004

* cited by examiner

EDGE-EMITTING LASER HAVING SMALL VERTICAL EMITTING ANGLE

This application claims the benefit of Taiwan Patent Application Serial No. 106115594 filed May 11, 2017, the subject matter of which is incorporated herein by reference.

BACKGROUND OF INVENTION

1. Field of the Invention

The invention relates to a structure of an optoelectronic component, and more particularly to the edge-emitting laser that utilizes an AlInAs epitaxial layer to obtain a design goal in achieving a laser device having a stable and small vertical emitting angle.

2. Description of the Prior Art

The semiconductor laser, or said as a laser diode, is featured in tiny volume, low power consumption, quick reaction, high impact-resistance, long service life, high efficiency, low pricing and so on. Hence, the semiconductor lasers are widely applied to various optoelectronic components and systems, such as light wave communication, information systems, home appliances, precision measurements and fiber communication.

Referring now to FIG. 1 and FIG. 2, a perspective and lateral side views of a typical edge-emitting laser diode component in the art are schematically shown, respectively. This conventional edge-emitting laser includes a bottom cladding layer 902, a lower separated confinement heterostructure (SCH) layer 9031, an active region layer 903, an upper SCH layer 9032, a top cladding layer 904 and a contact layer 905, orderly and epitaxially formed on a semiconductor substrate 901. The contact layer 905 and the top cladding layer 904 are integrated appropriately to form a ridge mesa 910.

Generally, in this type of the edge-emitting laser diode component, charge carriers, such as electrons and electron holes, would be injected into the active region layer 903, and then these charge carriers would be confined in a quantum well by a carrier barrier so as to couple and generate material gains. The confinement is achieved for a material energy gap of a barrier layer is higher than that of the quantum well, so that the quantum well would form a lower quantum energy to capture the carriers. A laser light field is confined in the lower SCH layer 9031, the active region layer 903 and the upper SCH layer 9032 by the top and bottom cladding layers 904, 902. Since a refractive index (an n value) of each of the top and bottom cladding layers 904, 902 us lower than that of any of the lower SCH layer 9031, the active region layer 903 and the upper SCH layer 9032, so the light field would be mature and then propagate in the material with a higher n value according to the total reflection theory. Coupling of the quantum wells between the light field and the active region layer 903 would determine a modal gain of the light field. The higher the modal gain is, the easier an optical loss can be overcome so as to achieve lasing of the light field. Namely, a threshold current for generating a laser beam can be lower easily. In order to have a higher modal gain, the light field needs to be confined in the active region layer 903. However, since a resonant cavity for light emitting in the edge-emitting laser diode component is a long narrow chamber and a specific Fourier transformation exists between a near field and a far field of the light field (as the near field converges, then the far field diverges), thus a laser light 999 emitted from the light-emitting edge 911 of the edge-emitting laser diode component would present a higher vertical angle and an elliptic light pattern having a vertical long axis.

By having the conventional edge-emitting laser diode component of FIG. 1 and FIG. 2 for example, layers, materials, thicknesses, doping parameters for manufacturing the conventional edge-emitting laser diode component of a 2.5G FP epitaxial structure are listed in Table 1. Also, refer to FIG. 3 for a computer model of the aforesaid edge-emitting laser diode component to simulate the near-field and far-field laser light-fields, in which the ridge mesa 910 is preset to have a 1.7-μm width. The simulation results of the light fields are shown in FIG. 4A, FIG. 4B and FIG. 4C. It is noted that the edge-emitting laser diode component of FIG. 3 is precisely an up-side-down structure of that of FIG. 1 and FIG. 2. Namely, in FIG. 3, the semiconductor substrate 901 is located on top. From the simulation results of the light fields shown in FIG. 4A, FIG. 4B and FIG. 4C, it is known that the conventional edge-emitting laser diode component has a beam-spread angle of 32.9 degrees in the vertical direction and 20.28 degrees in the horizontal direction. Thereupon, the cross section of the far-field laser light field would present an elliptic pattern having a vertical long axis.

TABLE 1

Example of the conventional edge-emitting laser diode component

| | Number of layer | Material | Thickness (nm) | Doping type | Concentration | Dopant |
|---|---|---|---|---|---|---|
| Contact layer 905 | 13 | $In_{0.53}Ga_{0.47}As$ | 200 | p | >1E19 | Zn |
| | 12 | InGaAsP (1.5 um) | 25 | p | >3E18 | Zn |
| | 11 | InGaAsP (1.3 um) | 25 | p | >3E18 | Zn |
| Top cladding layer 904 | 10 | InP | 1500 | p | 0.5~1E18 | Zn |
| | 9 | InGaAsP (1.1 um) | 25 | p | 1.00E+18 | Zn |
| | 8 | InP | 100 | p | 0.5~1E18 | Zn |
| Upper SCH layer 9032 | 7 | $In_{0.52}Al_{0.48}As$ | 50 | U/D | | |
| Active region layer 903 | 6 | U-GRIN | 60 | U/D | | |
| | (X4) 5 | InAlGaAs (well, 1.15% strain) | 4.5 | U/D | | |
| | (X5) 4 | InAlGaAs (barrier, −0.63% strain) | 8.5 | U/D | | |
| | 3 | U-GRIN | 60 | | | |
| Lower SCH layer 9031 | 2 | $In_{0.52}Al_{0.48}As$ | 100 | n | 8.00E+17 | Si |

TABLE 1-continued

Example of the conventional edge-emitting laser diode component

|  | Number of layer | Material | Thickness (nm) | Doping type | Concentration | Dopant |
|---|---|---|---|---|---|---|
| Bottom cladding layer 901, 902 | 1 | InP Buffer | 500 | n | 1.00E+18 | Si |
|  | Substrate 901 | InP | 350 μm | n | 2-8e18 | S |

Generally speaking, the conventional edge-emitting laser diode component usually has a vertical beam-spread angle (Full width at half maximum, FWHM) more than 30 degrees, but a horizontal beam-spread angle less than 20 degrees. The light-field pattern with such poor symmetricity would contribute definitely terrible efficiency in optical-fiber coupling, from which an unacceptable application thereof can be foreseen. Thus, the topic of reducing the vertical beam-spread angle of the laser light emitted by the conventional edge-emitting laser diode component so as to obtain a round far-field light pattern is surely welcome to the art.

SUMMARY OF THE INVENTION

Accordingly, it is the primary object of the present invention to provide an edge-emitting laser, which introduces an AlInAs epitaxial layer to ensure a small vertical emitting angle.

In the present invention, the edge-emitting laser with a small vertical emitting angle includes:

an InP substrate;

a bottom cladding layer, located on the substrate;

an active region layer, located on the bottom cladding layer;

a top cladding layer, located on the active region layer; and a contact layer, located on the top cladding layer;

wherein the bottom cladding layer further includes a passive waveguide layer sandwiched there inside, an extended bottom cladding layer is formed between the passive waveguide layer and the active region layer, the extended bottom cladding layer is a part of the bottom cladding layer, and a light refraction index of the passive waveguide layer is larger than that of the bottom cladding layer.

In one embodiment of the present invention, the edge-emitting laser further includes: a lower SCH layer, located between the bottom cladding layer and the active region layer; and, an upper SCH layer, located between the active region layer and the top cladding layer.

In one embodiment of the present invention, the InP substrate, the bottom cladding layer, the passive waveguide layer and the lower SCH layer are all n-type doped (i.e. n-typed doping); the top cladding layer and the contact layer are both p-type doped (i.e. p-typed doping); the bottom cladding layer and the top cladding layer are made of InP; the active region layer is made of In1-x-yAlxGayAs, wherein each of the x and the y is a real number between 0 and 1; the contact layer is made of InGaAs; and, the lower SCH layer and the upper SCH layer are made of $In_{0.52}Al_{0.48}As$.

In one embodiment of the present invention, the passive waveguide layer is a single-layer structure made of $In_{0.52}Al_{0.48}As$ and having a thickness within 0.2 μm~0.6 μm; and, the extended bottom cladding layer located between the passive waveguide layer and the active region layer has a thickness within 0.8 μm~1.6 μm.

In one embodiment of the present invention, the passive waveguide layer has a thickness within 0.4 μm~0.6 μm, and the extended bottom cladding layer has a thickness within 1.2 μm~1.4 μm.

In one embodiment of the present invention, the passive waveguide layer is a multi-layer structure including:

a lower waveguide layer, located on the bottom cladding layer, made of InGaAsP, having a thickness of 40 nm;

a spacer layer, located on the lower waveguide layer, made of InP, having a thickness of 50 nm; and an upper waveguide layer, located on the spacer layer, made of InGaAsP, having a thickness of 40 nm;

wherein the extended bottom cladding layer located between the passive waveguide layer and the active region layer has a thickness of 1.4 μm.

All these objects are achieved by the edge-emitting laser having a small vertical emitting angle described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an edge-emitting laser having a small vertical emitting angle. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the present invention, a bottom cladding layer of the edge-emitting laser further includes a passive waveguide layer and an extended bottom cladding layer located between the passive waveguide layer and the active region layer. The extended bottom cladding layer can be seen as a part of the bottom cladding layer. Also, a light refraction index (referred as an n-value) of the passive waveguide layer is greater than that of the bottom cladding layer, such that a passive light-guide structure without an active region layer can be formed by this passive waveguide layer with a higher light refraction index. Thereupon, the light field can extend toward the substrate, the extended bottom cladding layer is introduced to separate the passive waveguide layer from the active region layer by a predetermined space, and the near-field distribution of the laser light field inside the resonant cavity can be extended. Thus, the far-field laser light field with a smaller vertical emitting angle (i.e. a round light pattern) can be obtained.

Figure 5:
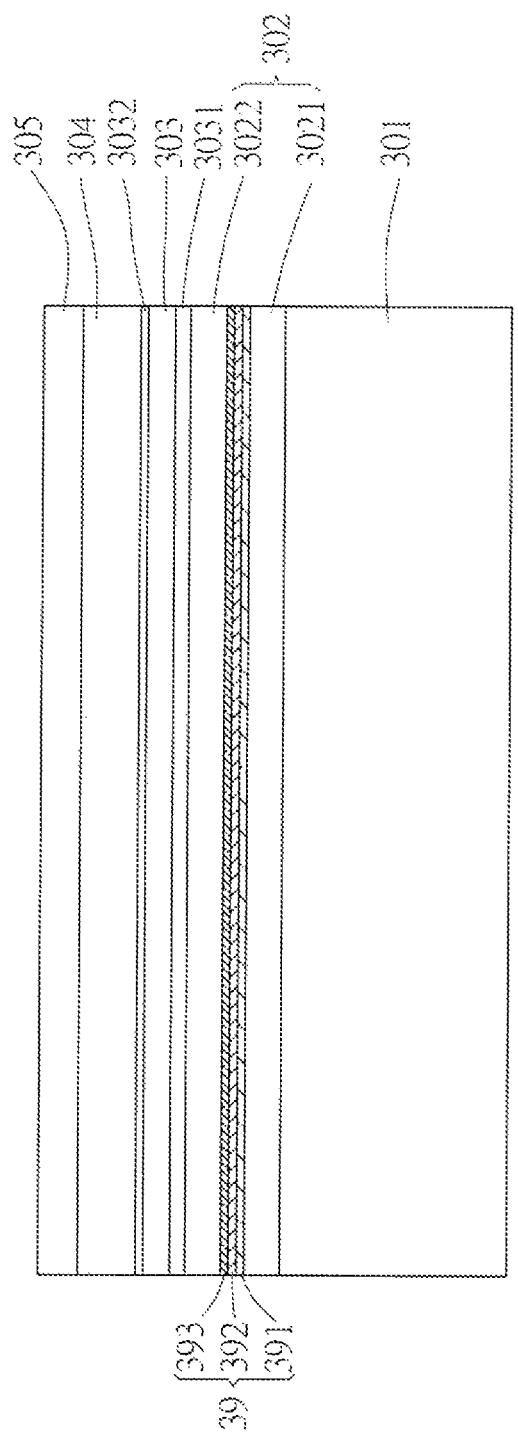
FIG. 5 is a schematically structural view of a first embodiment of the edge-emitting laser in accordance with the present invention.

Referring now to FIG. 5, a first embodiment of the edge-emitting laser invention accordance with the present invention is schematically shown. In this embodiment, the edge-emitting laser includes, in an upward order, at least an InP substrate 301, a bottom cladding layer 302, a passive waveguide layer 39 sandwiched in the bottom cladding layer 302, a lower SCH layer 3031, an active region layer 303, an upper SCH layer 3032, a top cladding layer 304 and a contact layer 305. Since the passive waveguide layer 39 is sandwiched within the bottom cladding layer 302, so the bottom cladding layer 302 is divided into a lower layer 3021 and an upper layer 3022, in which a portion of the upper layer 3022 located between the passive waveguide layer 39 and the active region layer 303 can be called as an extended bottom cladding layer 3022. Though the extended bottom cladding layer 3022 is a part of the bottom cladding layer 302, yet a light refraction index of the passive waveguide layer 39 is larger than that of the bottom cladding layer 302.

In the first embodiment of the edge-emitting laser as shown in FIG. 5, the passive waveguide layer 39 is a multi-layer structure including, in an upward order, a lower waveguide layer 391, a spacer layer 392 and an upper waveguide layer 393. Refer now to Table 2, layers, materials, thicknesses and doping parameters for manufacturing a first example of the edge-emitting laser of FIG. 5 in the 2.5G FP epitaxial structure are listed.

TABLE 2

First example of the edge-emitting laser diode component in accordance with the present invention

| | Number of layer | | Material | Thickness (nm) | Doping type | Concentration | Dopant |
|---|---|---|---|---|---|---|---|
| Contact layer 305 | 13 | | $In_{0.53}Ga_{0.47}As$ | 200 | p | >1E19 | Zn |
| | 12 | | InGaAsP (1.5 um) | 25 | p | >3E18 | Zn |
| | 11 | | InGaAsP (1.3 um) | 25 | p | >3E18 | Zn |
| Top cladding layer 304 | 10 | | InP | 1500 | p | 0.5~1E18 | Zn |
| | 9 | | InGaAsP (1.1 um) | 25 | p | 1.00E+18 | Zn |
| | 8 | | InP | 100 | p | 0.5~1E18 | Zn |
| Upper SCH layer 3032 | 7 | | $In_{0.52}Al_{0.48}As$ | 50 | U/D | | |
| Active region layer 303 | 6 | | U-GRIN | 60 | U/D | | |
| | (X4) | 5 | InAlGaAs (well, 1.15% strain) | 4.5 | U/D | | |
| | (X5) | 4 | InAlGaAs (barrier, −0.63% strain) | 8.5 | U/D | | |
| | 3 | | U-GRIN | 60 | | | |
| Lower SCH layer 3031 | 2 | | $In_{0.52}Al_{0.48}As$ | 100 | n | 8.00E+17 | Si |
| Extended bottom cladding layer 3022 | 1 | | InP Buffer | 1400 | n | 1.00E+18 | Si |
| Passive waveguide layer39 | a: 393 | | InGaAsP (1.165 um) | 40 | n | 1.00E+18 | Si |
| | b: 392 | | InP | 50 | n | 1.00E+18 | Si |
| | a: 391 | | InGaAsP (1.165 um) | 40 | n | 1.00E+18 | Si |
| Bottom cladding layer 301, 3021 | Lower layer of the bottom cladding layer 3021 | | InP | 50 | n | 1.00E+18 | Si |
| | Substrate 301 | | InP | 350 um | n | 2-8e18 | S |

From Table 2 and FIG. 5, it can be seen that, in this example, the lower waveguide layer 391 is located on the lower layer of the bottom cladding layer 3021, is made of InGaAsP, and has a thickness of 40 nm; the spacer layer 392 is located on the lower waveguide layer 391, is made of InP, and has a thickness of 50 nm; the upper waveguide layer 393 is located on the spacer layer 392, is made of InGaAsP, and has a thickness of 40 nm.; and, the extended bottom cladding layer 3022 is located between the passive waveguide layer 39 and the active region layer 303, and has a thickness of 1.4 µm. Regarding other details or parameters for each aforesaid epitaxial layer of the edge-emitting laser diode component, such as the numbers of sub-layers, the ingredients, the thicknesses, the doping types, the doped concentrations and the types of dopants, please refer to Table 2 directly, and thus details thereabout would be omitted herein.

By providing the first example of the edge-emitting laser diode component as shown in Table 2 and FIG. 5, though the vertical emitting angle of the laser light can be reduced to 28 degrees or less, yet such an improvement is mainly obtained by implanting two waveguide layers of the super lattice PQ (InGaAsP ~1.165 μm for example) for providing higher n values into the bottom cladding layer 302 at the side close to the InP substrate 301; namely, to form the lower waveguide layer 391 and the upper waveguide layer 393 inside the bottom cladding layer 302. However, such a design would raise at least two shortcomings as follows.

1. The PQ involves two group-V elements, and thus the epitaxial processes would be somehow uncontrollable. Thereby, the refraction index would be easier to be varied and thus further to influence the change of beam-spread angle.

2. Since the PQ layer is a multi-layer design, and the thickness of each layer is within 10 nm-100 nm, thus the manufacturing process would be more notorious but less controllable.

Accordingly, a second embodiment of the edge-emitting laser diode component in accordance with the present invention is provided to resolve the aforesaid disadvantages at the first embodiment.

Figure 6:
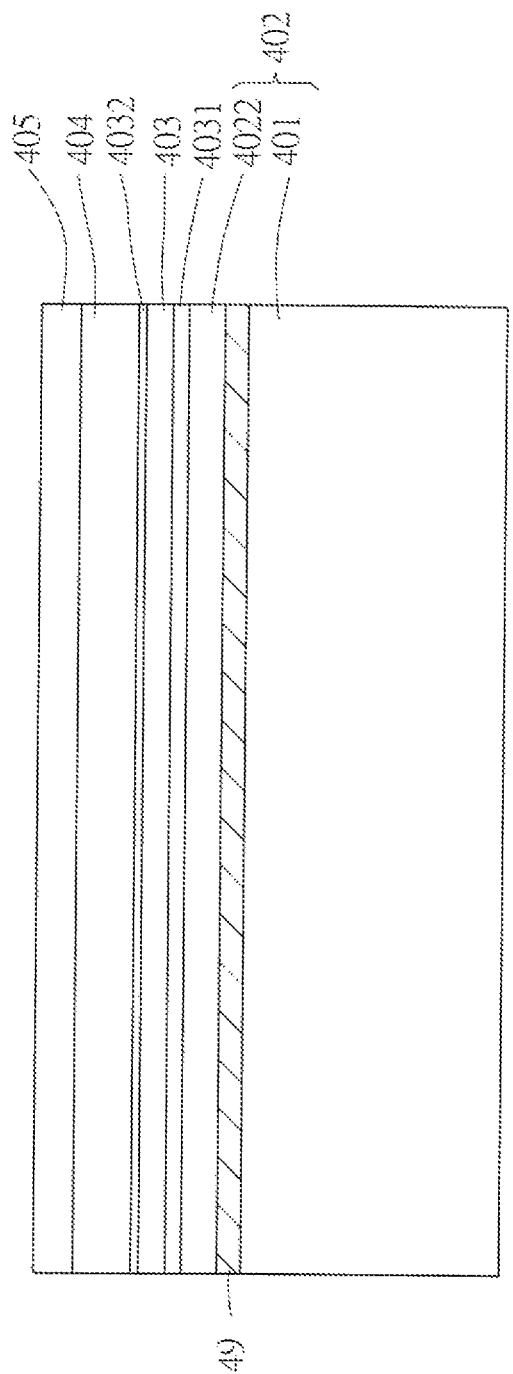
FIG. 6 is a schematically structural view of a second embodiment of the edge-emitting laser in accordance with the present invention.

Referring now to FIG. 6, the second embodiment of the edge-emitting laser in accordance with the present invention is schematically shown. In this second embodiment, similar to the aforesaid first embodiment, the edge-emitting laser epitaxially produced on an InP substrate 401 includes, in an upward order, at least a bottom cladding layer 402, a passive waveguide layer 49 sandwiched within the bottom cladding layer 402, a lower SCH layer 4031, an active region layer 403, an upper SCH layer 4032, a top cladding layer 404 and a contact layer 405. In this second embodiment, the substrate 401 provides substantially part of function of the bottom cladding layer 402. Also, since the passive waveguide layer 49 is sandwiched within the bottom cladding layer 302 at a side close to the substrate 401, thus the portion of the passive waveguide layer 49 between the passive waveguide layer 49 and the active region layer 403 can be called as an extended bottom cladding layer 4022. Namely, the extended bottom cladding layer 4022 is part of the bottom cladding layer 402.

In the present invention, a light refraction index of the passive waveguide layer 49 is larger than that of the bottom cladding layer 402.

In the second embodiment of the edge-emitting laser as shown in FIG. 6, the passive waveguide layer 49, obviously a single-layer structure to replace the PQ multi-layer design of the aforesaid first embodiment, is formed by a high-n-value $Al_xGa_yIn_{1-x-y}As$ (AlInAs, AlGaInAs or InGaAs for example) bulk in a lattice match. The merits of this embodiment are following.

1. The passive waveguide layer 49 uses a single element of group V (As), and thus the epitaxial process is more controllable.

2. The passive waveguide layer 49 is a single layer formed by a bulk film having a thickness within 50 nm-1000 nm, such that the manufacturing process is simpler and more controllable.

By applying the formulation of the aforesaid second embodiment, an edge-emitting laser diode component to provide a stable, even and small vertical angle can be thus organized to overcome the shortcomings of the aforesaid first embodiment in the PQ multi-layer design.

Refer now to Table 3, layers, materials, thicknesses and doping parameters for manufacturing a second example of the edge-emitting laser of FIG. 6 in the 2.5G FP epitaxial structure are listed.

TABLE 3

Second example of the edge-emitting laser diode component in accordance with the present invention

|  | Number of layer | Material | Thickness (nm) | Doping type | Concentration | Dopant |
|---|---|---|---|---|---|---|
| Contact layer 405 | 13 | $In_{0.53}Ga_{0.47}As$ | 200 | p | >1E19 | Zn |
|  | 12 | InGaAsP (1.5 um) | 25 | p | >3E18 | Zn |
|  | 11 | InGaAsP (1.3 um) | 25 | p | >3E18 | Zn |
| Top cladding layer 404 | 10 | InP | 1500 | p | 0.5~1E18 | Zn |
|  | 9 | InGaAsP (1.1 um) | 25 | p | 1.00E+18 | Zn |
|  | 8 | InP | 100 | p | 0.5~1E18 | Zn |
| Upper SCH layer 4032 | 7 | $In_{0.52}Al_{0.48}As$ | 50 | U/D |  |  |
| Active region layer 403 | 6 | U-GRIN | 60 | U/D |  |  |
|  | (X4) 5 | InAlGaAs (well, 1.15% strain) | 4.5 | U/D |  |  |
|  | (X5) 4 | InAlGaAs (barrier, −0.63% strain) | 8.5 | U/D |  |  |
|  | 3 | U-GRIN | 60 |  |  |  |
| Lower SCH layer 4031 | 2 | $In_{0.52}Al_{0.48}As$ | 100 | n | 8.00E+17 | Si |
| Extended bottom cladding layer 4022 | 1 | InP Buffer | 1400 | n | 1.00E+18 | Si |
| passive waveguide layer 49 | a | $In_{0.52}Al_{0.48}As$ | 500 | n | 1.00E+18 | Si |
| Bottom cladding layer 402, 401 | Substrate 401 | InP | 350 um | n | 2-8e18 | S |

From Table 3 and FIG. 6, in the second embodiment of the edge-emitting laser diode component in accordance with the present invention, the InP substrate 401, the bottom cladding layer 402 including the extended bottom cladding layer 4022, the passive waveguide layer 49 and the Lower SCH layer 4031 are all n-type doped. The top cladding layer 404 and the contact layer 405 are both p-type doped. The substrate 401, the bottom cladding layer 402 including the extended bottom cladding layer 4022, and the top cladding layer 404 are all made of the InP. The active region layer 403 is made of $In_{1-x-y}Al_xGa_yAs$, in which the x and y are both real number within 0~1. The contact layer 405 is mainly made of InGaAs, but a bottom portion of the contact layer 405 close to the top cladding layer 404 is produced to include a thinner InGaAsP layer as a transient area from the InP to the InGaAs, such that the energy levels of materials can be continuous so as to reduce the resistance. In addition, the lower SCH layer 4031 and the upper SCH layer 4032 are both made of $In_{0.52}Al_{0.48}As$. Regarding other details or parameters for each aforesaid epitaxial layer of the edge-emitting laser diode component, such as the numbers of sub-layers, the ingredients, the thicknesses, the doping types, the doped concentrations and the types of dopants, please refer to Table 3 directly, and thus details thereabout would be omitted herein.

Figure 1:
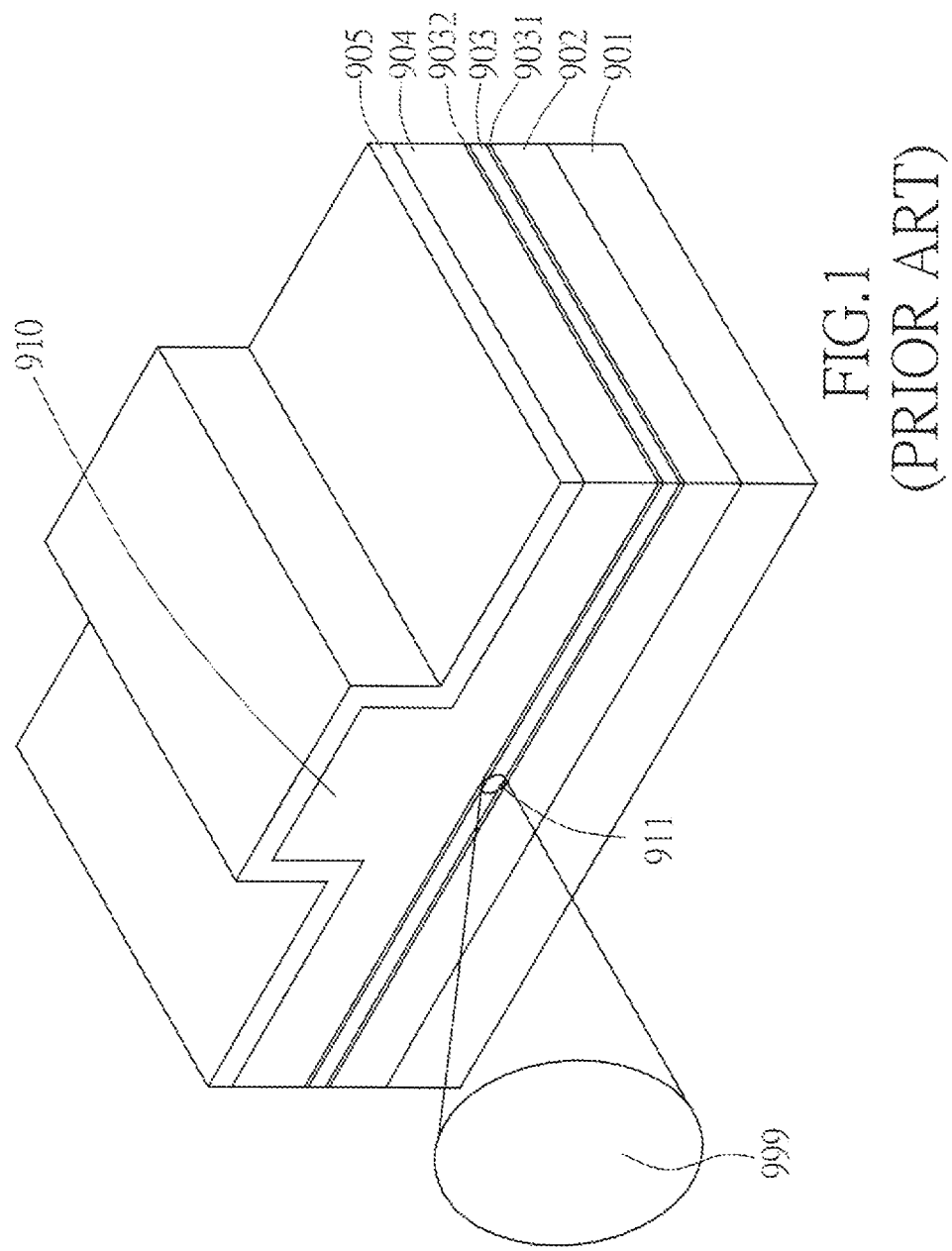
FIG. 1 is a schematically perspective view of a typical edge-emitting laser diode component in the art.
Figure 2:
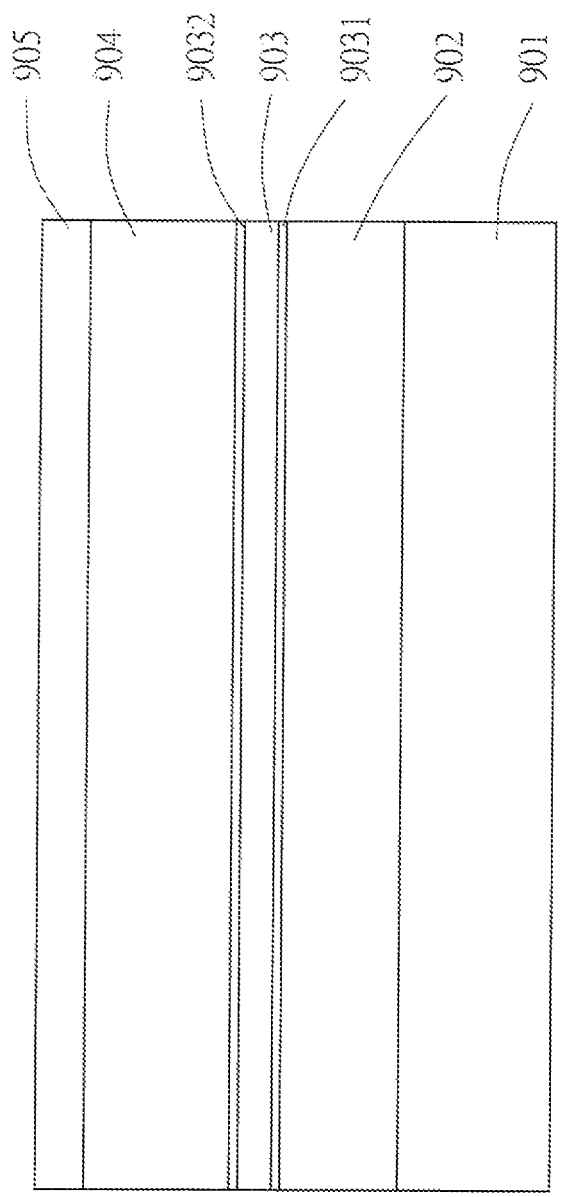
FIG. 2 is a lateral side view of FIG. 1.
Figure 3:
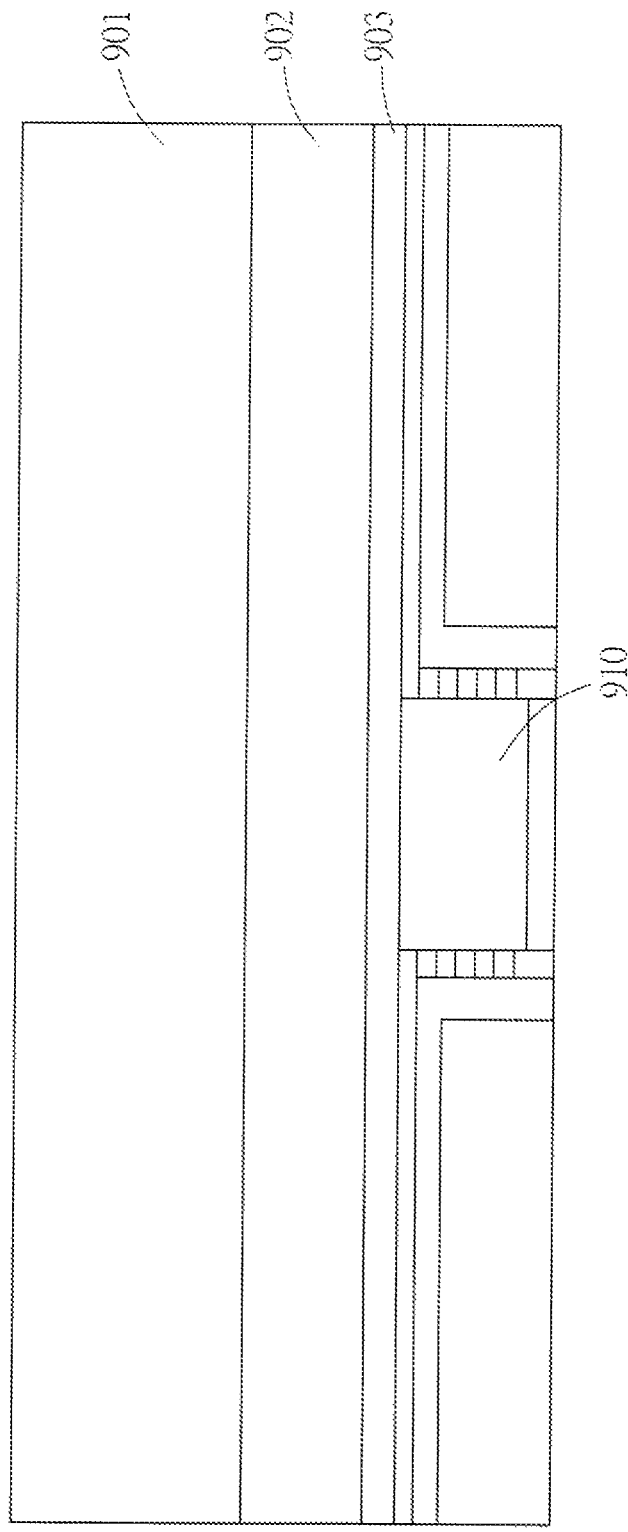
FIG. 3 is an up-side-down schematic view of a computer model for the typical edge-emitting laser diode component of FIG. 1.
Figure 4A:
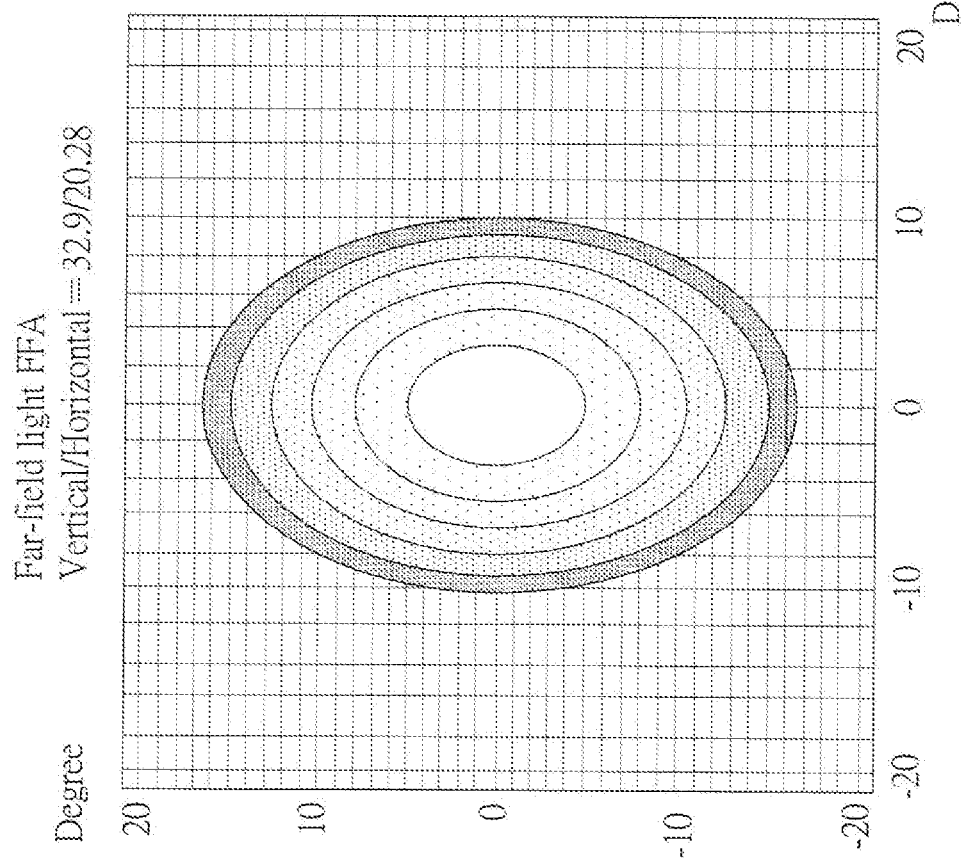
FIG. 4A, FIG. 4B and FIG. 4C illustrate schematically respective simulation results of light fields upon the near-field and far-field laser light fields based on the computer model of FIG. 3.
Figure 4B:
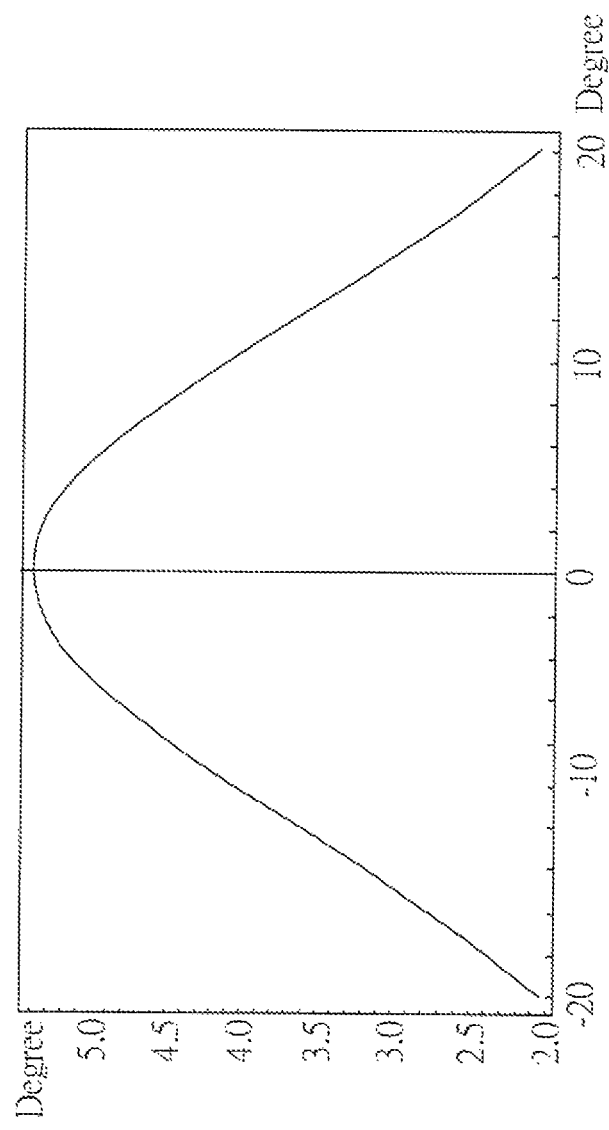
Figure 4C:
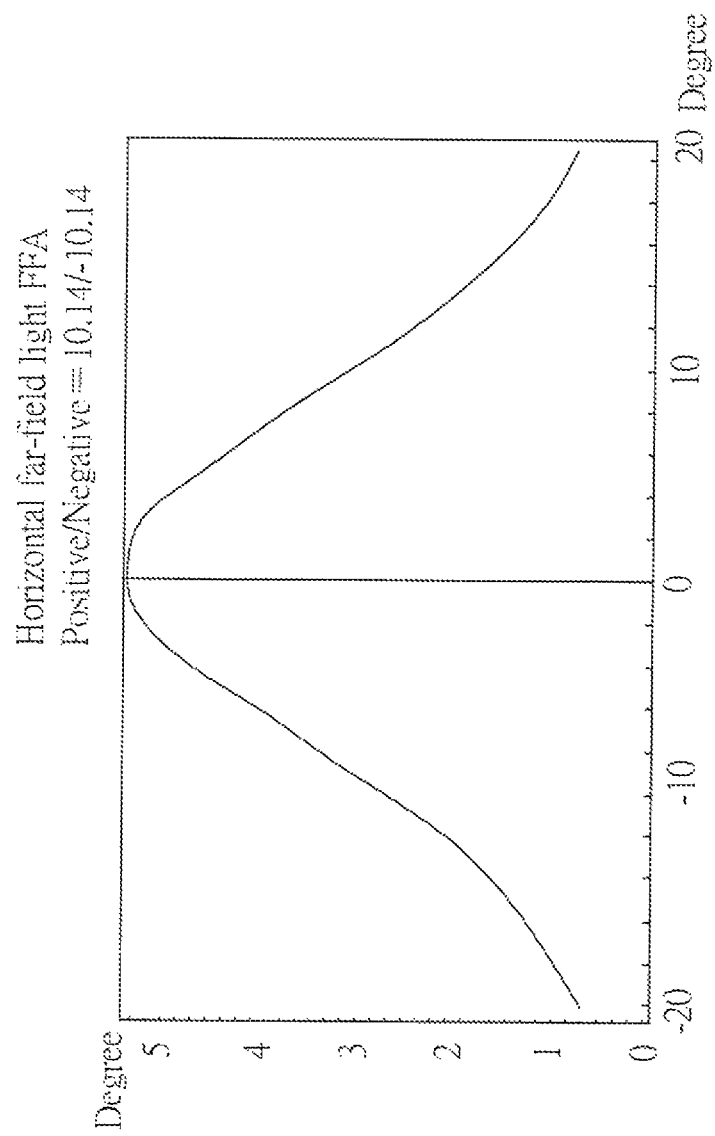
Figure 7A:
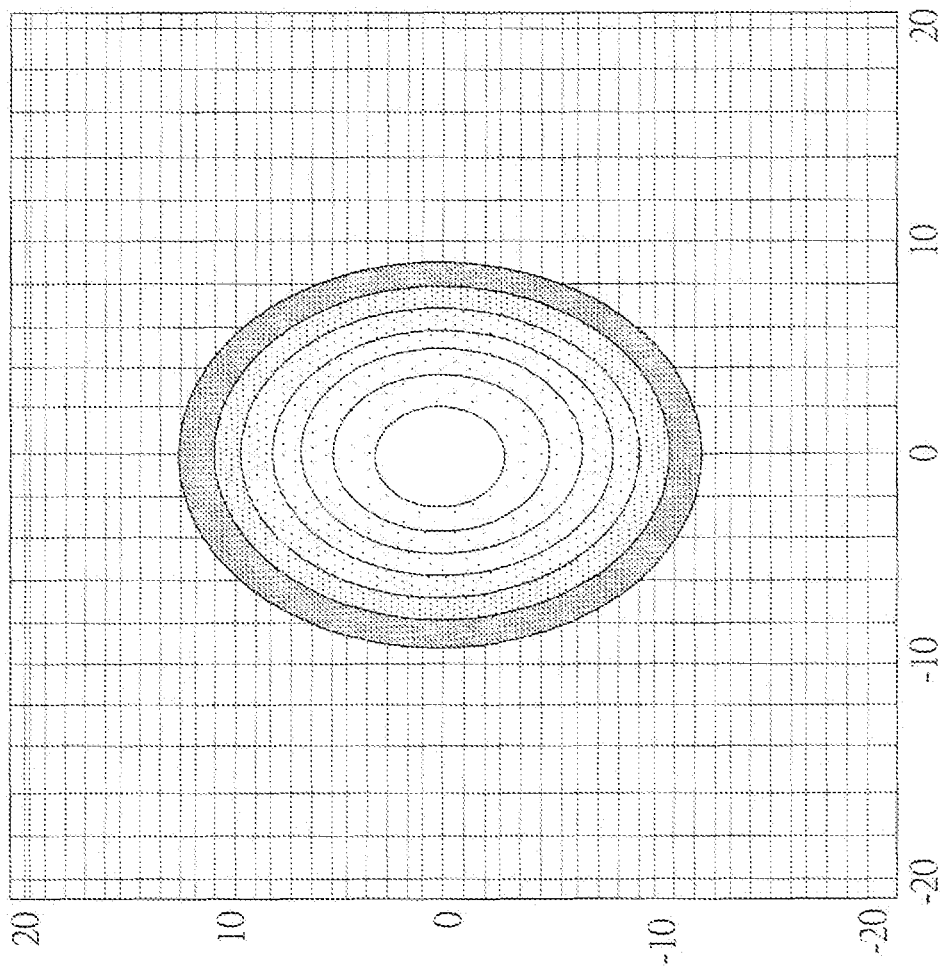
FIG. 7A, FIG. 7B and FIG. 7C illustrate schematically respective simulation results of light fields upon the near-field and far-field laser light fields based on the edge-emitting laser diode component of FIG. 6.
Figure 7B:
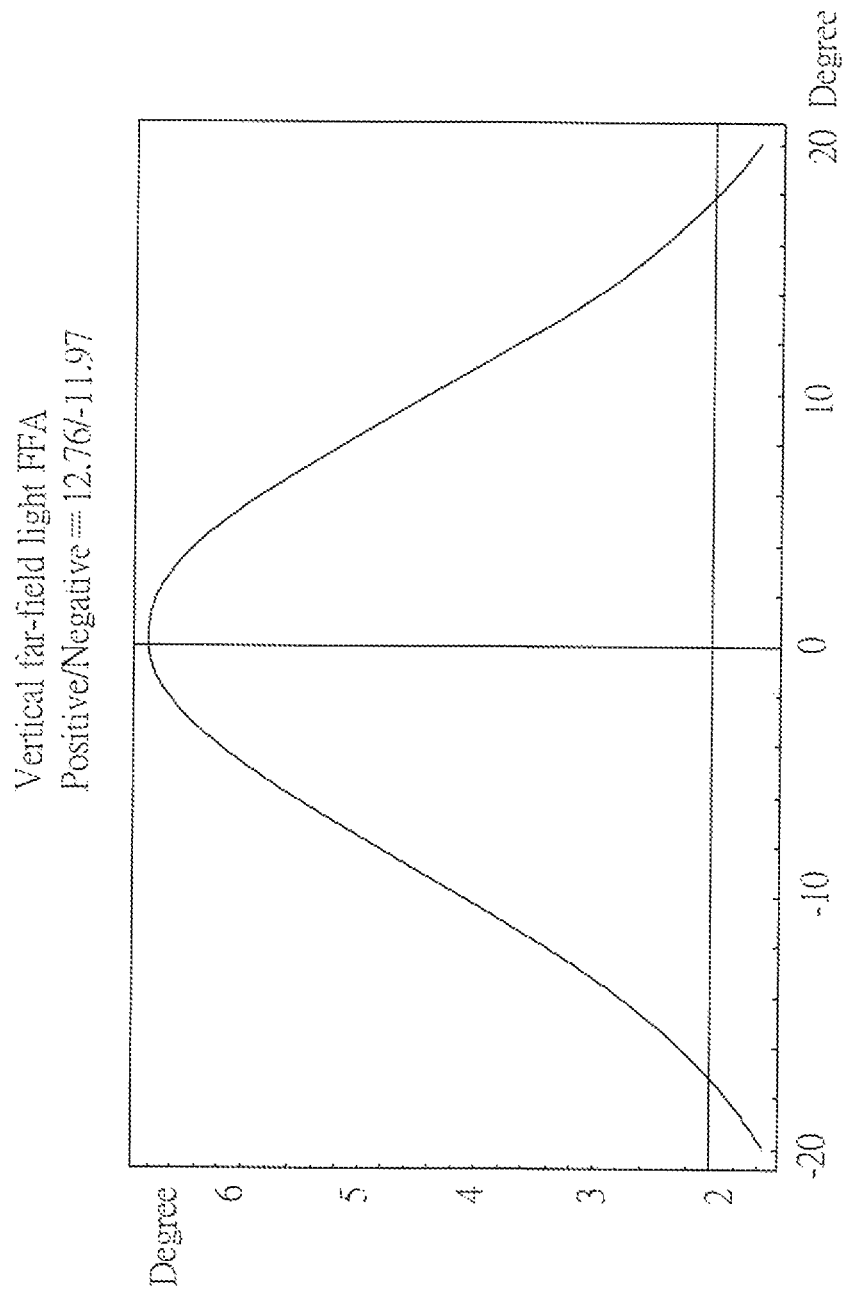
Figure 7C:
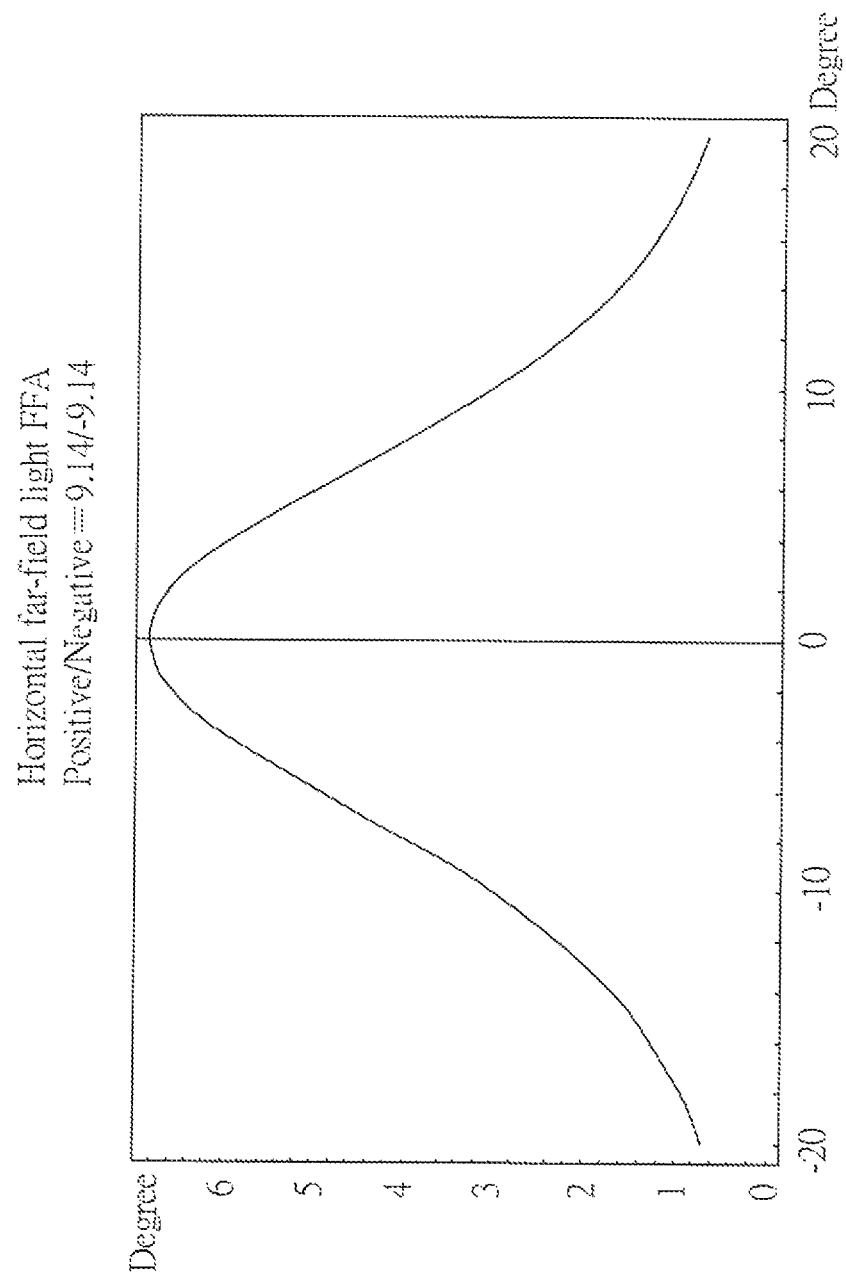

By having the second embodiment of the edge-emitting laser diode component of FIG. 6 as an example, in the case that layers, materials, thicknesses and doping parameters of Table 3 are applied for manufacturing the edge-emitting laser in the 2.5G FP epitaxial structure, the computer model of the edge-emitting laser diode component similar to that shown in FIG. 3, are applied to simulate the near-field and far-field laser light fields, and the width of the ridge mesa is set to be 1.7 µm; then simulation results of the light field are shown in FIG. 7A, FIG. 7B and FIG. 7C. From these simulation results, the vertical beam-spread angle of the second embodiment of the edge-emitting laser diode component as configured by FIG. 6 and Table 3 can be reduced to 24.73 degrees, while the horizontal beam-spread angle thereof is 18.28 degrees. Thus, by comparing to the simulation results of the light field shown in FIG. 4A through FIG. 4C, it is certain that the second embodiment of the edge-emitting laser diode component can obtain a far-field laser light pattern further close to a round pattern. In addition, by testing a practical specimen resembled to the edge-emitting laser diode component as configured by FIG. 6 and Table 3, the measured vertical beam-spread angle thereof is 22.49 degrees, and the measured horizontal beam-spread angle thereof is 19.16 degrees. In comparison with the conventional edge-emitting laser diode component, the edge-emitting laser diode component of the present invention does have a laser light pattern close to a round pattern and largely fulfilling the simulation results of the light field shown in FIG. 7A through FIG. 7C.

One major feature of the present invention is to use a single group-V element (As) and a layer of InAlGaAs bulk material to design the passive waveguide layer 49, such that a stable and simple-structured laser with a small vertical beam-spread angle can be obtained. It is also noted that the passive waveguide layer 49 of the present invention is located under the active region layer 403 and above the InP substrate 401. Further, two more structural features of the present invention shall be mentioned as follows.

1. The material of the extended bottom cladding layer 4022 is InP that can provide a small n value.

2. The material of the passive waveguide layer 49 is AlxGayIn1-x-yAs that can provide a larger n value.

Hence, in the present invention, only the extended bottom cladding layer 4022 and the passive waveguide layer 49 are well arranged to have appropriate thicknesses, and then the laser with a small vertical beam-spread angle and good properties can be obtained. Generally speaking, the extended bottom cladding layer 4022 (made of InP) shall have a specific thickness so as able to extend the near-field distribution. On the other hand, if the thickness thereof is too over, then excessive epitaxial time would be needed. In the present invention, an appropriate thickness would be within 500 nm-2000 nm. The passive waveguide layer 49 (made of $Al_xGa_yIn_{1-x-y}As$) shall also have a certain thickness to induce effectively a light field, but the increase in thickness would sacrifice the modal gain. Namely, an optimal trade-off relation in between can be obtained through relevant calculations. Further, if the thickness of the passive waveguide layer 49 exceeds a certain value, then a multi-mode would appear to fail the device. In the present invention, the appropriate thickness would be within 100 nm-1000 nm. Through computer simulation to perform calculations upon various thicknesses for the extended bottom cladding layer 4022 and the passive waveguide layer 49, the results are listed in Tables 4 and 5 as follows, so that differences in the vertical far-field angle and the modal gain can be clearly observed among various thickness pairs of the extended bottom cladding layer 4022 and the passive waveguide layer 49.

TABLE 4

Performance in vertical far-field angle of the edge-emitting laser of the present invention for various thickness pairs of the passive waveguide layer 49 (made of $In_{0.52}Al_{0.48}As$) and the extended bottom cladding layer 4022 (made of InP)

| Vertical far-field angle (°) | | Thickness of extended bottom cladding layer (µm) | | | | | | | |
|---|---|---|---|---|---|---|---|---|---|
| | | 0.6 | 0.8 | 1 | 1.2 | 1.4 | 1.6 | 1.8 | 2 |
| Thickness of passive waveguide layer (µm) | 0.1 | 30.53 | 30.29 | 30.22 | 30.31 | 30.45 | 30.64 | 30.83 | 30.98 |
| | 0.2 | 29.37 | 28.82 | 28.7 | 28.78 | 29.09 | 29.44 | 29.89 | 30.24 |
| | 0.3 | 28.12 | 27.25 | 26.94 | 26.99 | 27.38 | 27.92 | 28.61 | 29.25 |
| | 0.4 | 26.88 | 25.66 | 25.04 | 24.94 | 25.27 | 25.93 | 26.82 | 27.79 |
| | 0.5 | 25.77 | 24.14 | 23.14 | 22.69 | 22.78 | 23.33 | 24.31 | 25.51 |
| | 0.6 | 24.87 | 22.88 | 21.42 | 20.43 | 20.01 | 20.09 | 20.77 | 21.87 |
| | 0.7 | 24.27 | 22.15 | 20.37 | 18.87 | 17.7 | 16.9 | 16.58 | 16.81 |
| | 0.8 | 24.04 | 22.15 | Multi. | Multi. | Multi. | Multi. | Multi. | Multi. |
| | 0.9 | Multi. | 20.28 | Multi. | Multi. | Multi. | Multi. | Multi. | Multi. |
| | 1 | Multi. | Multi. | Multi. | Multi. | Multi. | Multi. | Multi. | Multi. |

TABLE 5

Performance in modal gain of the edge-emitting
laser of the present invention for various thickness pairs of the passive
waveguide layer 49 and the extended bottom cladding layer 4022

| Modal gain (cm$^{-1}$) | | Thickness of extended bottom cladding layer (μm) | | | | | | | |
|---|---|---|---|---|---|---|---|---|---|
| | | 0.6 | 0.8 | 1 | 1.2 | 1.4 | 1.6 | 1.8 | 2 |
| Thickness of passive waveguide layer (μm) | 0.1 | 75.85007 | 76.57527 | 77.09871 | 77.42134 | 77.61289 | 77.71973 | 77.78032 | 77.81161 |
| | 0.2 | 73.41544 | 75.00169 | 76.15863 | 76.88414 | 77.31902 | 77.55928 | 77.69611 | 77.76659 |
| | 0.3 | 70.37972 | 72.93678 | 74.88504 | 76.14881 | 76.91267 | 77.34095 | 77.57997 | 77.70646 |
| | 0.4 | 66.50494 | 70.064 | 73.00338 | 75.03352 | 76.285 | 77.00393 | 77.40155 | 77.61373 |
| | 0.5 | 61.41886 | 65.7681 | 69.8989 | 73.0595 | 75.14443 | 76.37464 | 77.07298 | 77.4403 |
| | 0.6 | 54.68789 | 58.96424 | 64.0608 | 68.78181 | 72.44596 | 74.80947 | 76.23728 | 77.00105 |
| | 0.7 | 46.07284 | 48.23831 | 51.97099 | 56.94902 | 62.66072 | 67.99794 | 72.14713 | 74.78017 |
| | 0.8 | 36.05811 | 33.72327 | Multi. | Multi. | Multi. | Multi. | Multi. | Multi. |
| | 0.9 | Multi. | 33.48295 | Multi. | Multi. | Multi. | Multi. | Multi. | Multi. |
| | 1 | Multi. | Multi. | Multi. | Multi. | Multi. | Multi. | Multi. | Multi. |

In these two tables, the notation "Multi" stands for "multi-mode".

Figure 8A:
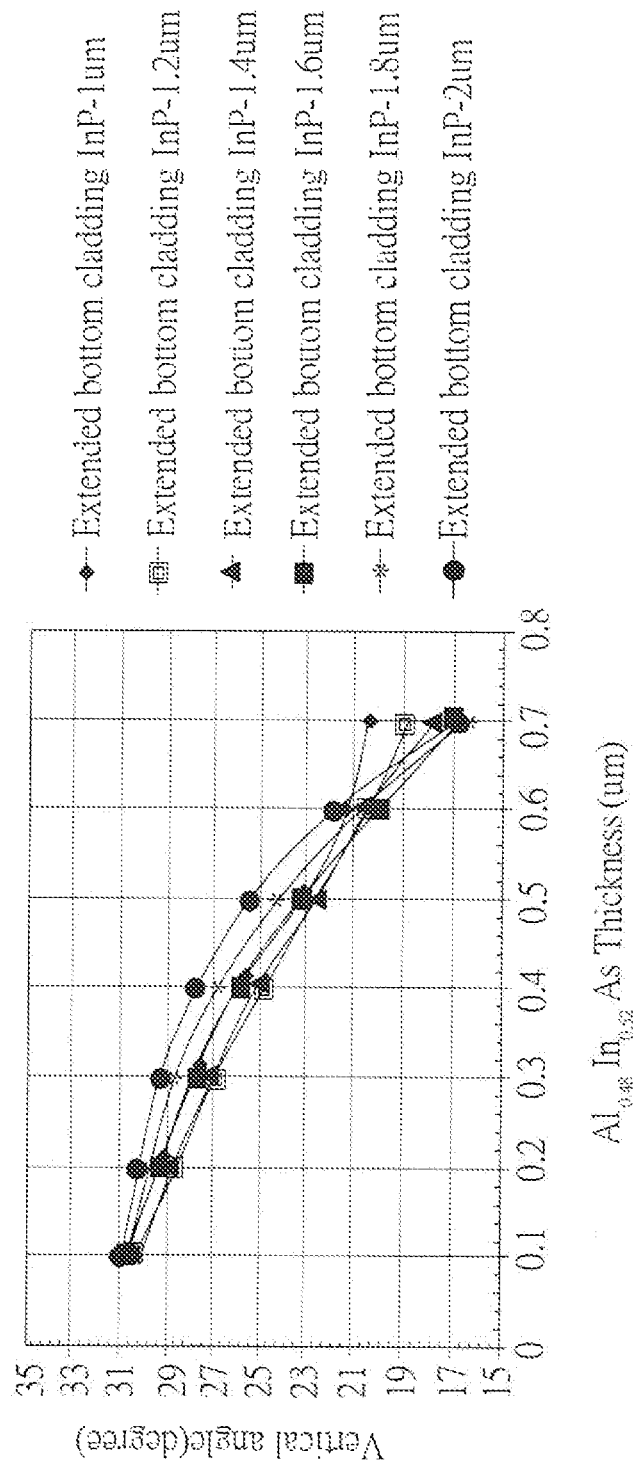
FIG. 8A and FIG. 8B are curves plotted based on corresponding data in Tables 4 and 5, respectively.
Figure 8B:
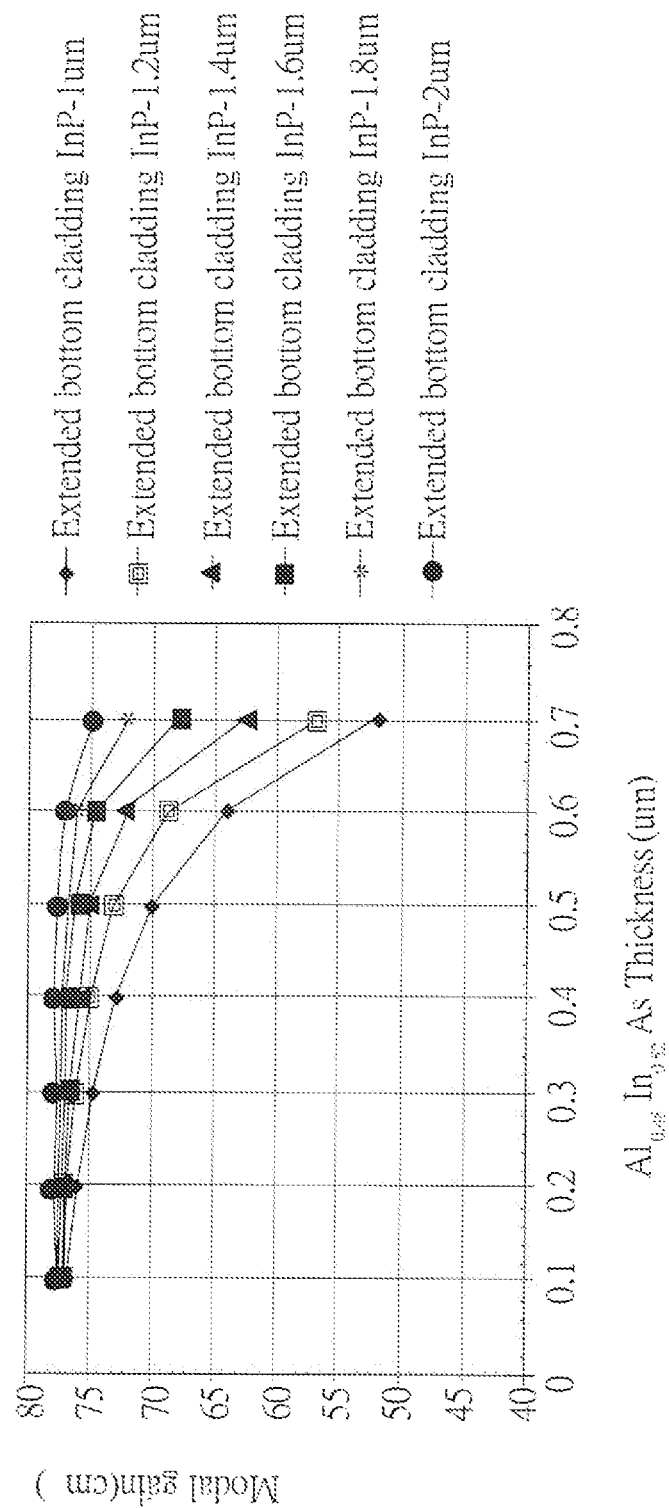

Also, referring to FIG. 8A and FIG. 8B, corresponding curves are plotted according to respective data listed in Table 4 and Table 5.

From the aforesaid Table 4 and Table 5, if it is desired to have a vertical far field angle of the edge-emitting laser less than 30 degrees and a modal gain thereof higher than 60, then the thickness of the passive waveguide layer 49 (made of $In_{0.52}Al_{0.48}As$) is within 0.21 μm~0.6 μm, and the thickness of the extended bottom cladding layer 4022 (made of InP) is preferably within 0.8 μm~1.6 μm. If it is desired to have better performance in the laser light field and the modal gain, then, in the preferred embodiment of the present invention, the thickness of the passive waveguide layer is within 0.4 μm~0.6 μm, and the thickness of the extended bottom cladding layer is 1.2 μm~1.4 μm. At this time, the vertical far-field angle can be lowered to about 25 degrees, and the modal gain can reach a value close to 70. Thereupon, the shortcoming of the conventional edge-emitting laser having a vertical far-field angle larger than 30 degrees can be thus improved, without trading off good performance in the modal gain.

While the present invention has been particularly shown and described with reference to a preferred embodiment, it will be understood by those skilled in the art that various changes in form and detail may be without departing from the spirit and scope of the present invention.

What is claimed is:

1. An edge-emitting laser having a small vertical emitting angle, comprising:
    an InP substrate;
    a passive waveguide layer, located above the substrate;
    an extended bottom cladding layer, located on the passive waveguide layer, said extended bottom cladding layer being made of InP;
    an active region layer, located on the extended bottom cladding layer;
    a top cladding layer, located on the active region layer, said top cladding layer being made of InP; and
    a contact layer, located on the top cladding layer;
    wherein a light refraction index of the passive waveguide layer is larger than that of the extended bottom cladding layer.

2. The edge-emitting laser having a small vertical emitting angle of claim 1, further including:
    a lower SCH layer, located between the extended bottom cladding layer and the active region layer; and
    an upper SCH layer, located between the active region layer and the top cladding layer.

3. The edge-emitting laser having a small vertical emitting angle of claim 2, wherein:
    the InP substrate, the passive waveguide layer, the extended bottom cladding layer and the lower SCH layer are all n-type doped (i.e. n-typed doping);
    the top cladding layer and the contact layer are both p-type doped (i.e. p-typed doping);
    the active region layer is made of $In_{1-x-y}Al_xGa_yAs$, wherein each of the x and the y is a real number between 0 and 1;
    the contact layer is made of InGaAs; and,
    the lower SCH layer and the upper SCH layer are made of $In_{0.52}Al_{0.48}As$.

4. The edge-emitting laser having a small vertical emitting angle of claim 1, wherein:
    the passive waveguide layer is a single-layer structure made of $In_{0.52}Al_{0.48}As$ and having a thickness within 0.2 μm~0.6 μm; and, the extended bottom cladding layer located between the passive waveguide layer and the active region layer has a thickness within 0.8 μm~1.6 μm.

5. The edge-emitting laser having a small vertical emitting angle of claim 4, wherein the passive waveguide layer has a thickness within 0.4 μm~0.6 μm, and the extended bottom cladding layer has a thickness within 1.2 μm~1.4 μm.

6. The edge-emitting laser having a small vertical emitting angle of claim 1, wherein the passive waveguide layer is a multi-layer structure including:
    a lower waveguide layer, located on the bottom cladding layer, made of InGaAsP, having a thickness of 40 nm;
    a spacer layer, located on the lower waveguide layer, made of InP, having a thickness of 50 nm; and
    an upper waveguide layer, located on the spacer layer, made of InGaAsP, having a thickness of 40 nm;
    wherein the extended bottom cladding layer located between the passive waveguide layer and the active region layer has a thickness of 1.4 μm.

7. The edge-emitting laser having a small vertical emitting angle of claim 2, further including:
    a lower layer located between the InP substrate and the passive waveguide layer, said lower layer being made of InP and n-type doped (i.e. n-typed doping).

* * * * *